US012690418B2

(12) United States Patent
Koshti et al.

(10) Patent No.: US 12,690,418 B2
(45) Date of Patent: Jul. 21, 2026

(54) APPARATUS FOR CLAMPING A SUBSTRATE ON A MONO-POLAR ELECTROSTATIC CHUCK FOR DEPOSITION OF PHOTORESIST FILMS

(71) Applicant: Applied Materials, Inc., Santa Clara, CA (US)

(72) Inventors: Sushim Koshti, West Linn, OR (US); Vijay Parkhe, San Jose, CA (US); Nitin Bharadwaj Satyavolu, Santa Clara, CA (US); Venugopal Vellanki, San Jose, CA (US); Niranjana Balesan, Fremont, CA (US); Ashutosh Sawant, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 18/628,136

(22) Filed: Apr. 5, 2024

(65) Prior Publication Data

US 2024/0404861 A1　　Dec. 5, 2024

Related U.S. Application Data

(60) Provisional application No. 63/470,088, filed on May 31, 2023.

(51) Int. Cl.
　H01T 23/00　　(2006.01)
　C23C 16/458　　(2006.01)
　　　　(Continued)

(52) U.S. Cl.
　CPC ........ H10P 72/722 (2026.01); C23C 16/4585 (2013.01); C23C 16/4586 (2013.01);
　　　　(Continued)

(58) Field of Classification Search
　CPC .................................................. H01L 21/6833
　See application file for complete search history.

(56) References Cited

U.S. PATENT DOCUMENTS 3,837,944 A　　9/1974　Cole, Jr.
4,283,482 A　　8/1981　Hattori et al.
　　　　(Continued)

FOREIGN PATENT DOCUMENTS

CN　　　108351594　A　　7/2018
EP　　　　0090615　A2　　10/1983
　　　　(Continued)

OTHER PUBLICATIONS

International Search Report and Written Opinion from PCT/US2024/026513 dated Aug. 20, 2024, 7 pgs.
　　　　(Continued)

*Primary Examiner* — Stephen W Jackson
(74) *Attorney, Agent, or Firm* — Schwabe, Williamson & Wyatt, P.C.

(57) ABSTRACT

Apparatuses for clamping a substrate on a mono-polar electrostatic chuck for deposition of photoresist films are disclosed. In an example, a lift-pin assembly includes a first metal spring, a first metal above and coupled to the first metal spring, a second metal spring above and coupled to the first metal, a second metal above and coupled to the second metal spring, and a ceramic above and coupled to the second metal.

19 Claims, 12 Drawing Sheets

(51) Int. Cl.
    *H01J 37/32*       (2006.01)
    *H10P 72/72*      (2026.01)
    *H10P 72/76*      (2026.01)

(52) U.S. Cl.
    CPC .. *H01J 37/32642* (2013.01); *H01J 37/32724*
        (2013.01); *H10P 72/7612* (2026.01); *H10P*
        *72/7616* (2026.01); *H10P 72/7624* (2026.01);
        *H01J 2237/3321* (2013.01); *H01J 2237/3323*
                        (2013.01)

(56) References Cited

U.S. PATENT DOCUMENTS

| | | |
|---|---|---|
| 4,292,384 A | 9/1981 | Straughan et al. |
| 4,320,191 A | 3/1982 | Yoshikawa et al. |
| 4,332,879 A | 6/1982 | Pastor et al. |
| 4,464,455 A | 8/1984 | Yoneda et al. |
| 4,560,641 A | 12/1985 | Kokaku et al. |
| 4,842,989 A | 6/1989 | Taniguchi et al. |
| 5,310,624 A | 5/1994 | Ehrlich |
| 5,366,852 A | 11/1994 | Pavelchek et al. |
| 5,439,780 A | 8/1995 | Joshi et al. |
| 5,457,005 A | 10/1995 | Babich et al. |
| 5,763,016 A | 6/1998 | Levenson et al. |
| 5,885,751 A | 3/1999 | Weidman et al. |
| 6,204,168 B1 | 3/2001 | Naik et al. |
| 6,589,715 B2 | 7/2003 | Joubert et al. |
| 6,825,562 B2 | 11/2004 | Naik et al. |
| 6,855,485 B2 | 2/2005 | Irie |
| 6,989,227 B2 | 1/2006 | Weidman et al. |
| 7,064,076 B2 | 6/2006 | Kulkarni |
| 7,713,678 B2 | 5/2010 | Hosoda |
| 7,771,895 B2 | 8/2010 | Wu et al. |
| 8,465,903 B2 | 6/2013 | Weidman et al. |
| 8,536,068 B2 | 9/2013 | Weidman et al. |
| 8,709,706 B2 | 4/2014 | Wu et al. |
| 8,940,386 B2 | 1/2015 | Ohtani et al. |
| 9,229,326 B2 | 1/2016 | Lu et al. |
| 9,310,684 B2 | 4/2016 | Meyers et al. |
| 9,354,508 B2 | 5/2016 | Beasley et al. |
| 9,411,237 B2 | 8/2016 | Xie et al. |
| 9,417,515 B2 | 8/2016 | Barman et al. |
| 9,470,980 B2 | 10/2016 | Inoue et al. |
| 9,632,411 B2 | 4/2017 | Michaelson et al. |
| 9,778,561 B2 | 10/2017 | Marks et al. |
| 9,829,805 B2 | 11/2017 | Michaelson et al. |
| 9,996,004 B2 | 6/2018 | Smith et al. |
| 10,228,618 B2 | 3/2019 | Meyers et al. |
| 10,642,153 B2 | 5/2020 | Meyers et al. |
| 10,658,180 B1 | 5/2020 | Mignot et al. |
| 10,787,466 B2 | 9/2020 | Edson et al. |
| 10,831,096 B2 | 11/2020 | Marks et al. |
| 11,598,005 B2 * | 3/2023 | Murakami .......... H01J 37/3244 |
| 11,599,022 B2 | 3/2023 | Stowers et al. |
| 11,621,172 B2 | 4/2023 | Kalutarage et al. |
| 2001/0008227 A1 | 7/2001 | Sadamoto et al. |
| 2002/0144657 A1 * | 10/2002 | Chiang .............. C23C 16/4412 |
| | | 118/728 |
| 2004/0091618 A1 | 5/2004 | Park et al. |
| 2004/0214113 A1 | 10/2004 | Goldstein et al. |
| 2006/0156981 A1 | 7/2006 | Fondurulia et al. |
| 2011/0294072 A1 | 12/2011 | Park et al. |
| 2014/0356770 A1 | 12/2014 | Hayashi |
| 2015/0056542 A1 | 2/2015 | Meyers et al. |
| 2015/0200091 A1 | 7/2015 | Chada et al. |
| 2016/0011502 A1 | 1/2016 | Hofmann et al. |
| 2016/0116839 A1 | 4/2016 | Meyers et al. |
| 2016/0329222 A1 | 11/2016 | Xie et al. |
| 2017/0186614 A1 | 6/2017 | Ko et al. |
| 2017/0261850 A1 | 9/2017 | Stowers et al. |
| 2017/0271152 A1 | 9/2017 | Char et al. |
| 2018/0173096 A1 | 6/2018 | Zi et al. |
| 2018/0307137 A1 | 10/2018 | Meyers et al. |
| 2019/0131130 A1 | 5/2019 | Smith et al. |
| 2019/0153001 A1 | 5/2019 | Cardineau et al. |
| 2019/0308998 A1 | 10/2019 | Cardineau et al. |
| 2019/0315781 A1 | 10/2019 | Edson et al. |
| 2019/0337969 A1 | 11/2019 | Odedra et al. |
| 2019/0384171 A1 | 12/2019 | Zi et al. |
| 2020/0064733 A1 | 2/2020 | Meyers et al. |
| 2020/0073238 A1 | 3/2020 | Zi et al. |
| 2020/0176246 A1 | 6/2020 | Huotari et al. |
| 2020/0223877 A1 | 7/2020 | Odedra et al. |
| 2020/0239498 A1 | 7/2020 | Clark |
| 2020/0241413 A1 | 7/2020 | Clark et al. |
| 2021/0005504 A1 * | 1/2021 | Han ................. H01L 21/68785 |
| 2022/0004105 A1 | 1/2022 | Dai et al. |
| 2022/0020584 A1 | 1/2022 | Volosskiy et al. |
| 2022/0244645 A1 | 8/2022 | Tan et al. |
| 2022/0306657 A1 | 9/2022 | Fabulyak et al. |
| 2022/0308447 A1 | 9/2022 | Stowers et al. |
| 2023/0019943 A1 | 1/2023 | Nakabayashi et al. |
| 2023/0078946 A1 | 3/2023 | Grzeskowiak et al. |
| 2023/0100995 A1 | 3/2023 | Cardineau et al. |
| 2023/0143629 A1 | 5/2023 | Clark |
| 2023/0152705 A1 | 5/2023 | Grzeskowiak et al. |
| 2023/0197505 A1 | 6/2023 | Lutker-Lee et al. |
| 2023/0215736 A1 | 7/2023 | Kalutarage et al. |
| 2023/0290646 A1 | 9/2023 | Kalutarage et al. |

FOREIGN PATENT DOCUMENTS

| | | |
|---|---|---|
| EP | 0100079 A2 | 2/1984 |
| EP | 1033744 A2 | 9/2000 |
| EP | 2926199 B1 | 9/2020 |
| JP | H05100425 A | 4/1993 |
| JP | 08320574 A | 12/1996 |
| JP | 2000100915 A | 4/2000 |
| JP | 2006303138 A | 11/2006 |
| JP | 2014209622 A1 | 11/2014 |
| JP | 2017116923 A | 6/2017 |
| JP | 2019500490 A | 1/2019 |
| JP | 2020510994 A | 4/2020 |
| TW | 201443271 A | 11/2014 |
| TW | 201601444 A | 1/2016 |
| TW | 201635334 A | 10/2016 |
| TW | 201841258 A | 11/2018 |
| TW | 201907517 A | 2/2019 |
| TW | 202006168 A | 2/2020 |
| TW | 202016279 A | 5/2020 |
| TW | 202117468 A | 5/2021 |
| TW | 202306023 A | 2/2023 |
| WO | 9900837 A1 | 1/1999 |
| WO | 2004095551 A1 | 11/2004 |
| WO | 2018004646 | 1/2018 |
| WO | 2019217749 A1 | 11/2019 |
| WO | 2020081483 A1 | 4/2020 |
| WO | 2020132281 A1 | 6/2020 |
| WO | 2020264158 A1 | 12/2020 |
| WO | 2020264557 A1 | 12/2020 |
| WO | 2020264571 A1 | 12/2020 |
| WO | 2021072042 A1 | 4/2021 |
| WO | 2021146138 A1 | 7/2021 |
| WO | 2021158433 A1 | 8/2021 |
| WO | 2021202146 A1 | 10/2021 |
| WO | 2022004211 A1 | 1/2022 |
| WO | 2022103764 A1 | 5/2022 |
| WO | 2022265874 A1 | 12/2022 |
| WO | 2023009364 A1 | 2/2023 |

OTHER PUBLICATIONS

International Search Report and Written Opinion from PCT/US2023/032497 dated Jan. 3, 2024, 9 pgs.
Official Letter from Taiwan Patent Application No. 112128099 dated Dec. 22, 2023, 6 pgs.
Chang, et al., "Gas-phase silicon micromachining with xenon difluoride," SPIE vol. 2641, 1995, pp. 117-128.
Mori, et al., "Prediction of Resolution using wet-develop type single layer and dry-development process for EUV lithography," Elsevier Science 2000, pp. 689-692.

(56)  References Cited

OTHER PUBLICATIONS

Seniutinas, "Development of high-resolution 3D nanotechnology tools: sensors focus," Swinburn University of Technology 2016, pp. 1-261.

Ito, et al., "Chemical Amplification in the Design of Dry Developing Resist Materials," Polymer Engineering and Science, Dec. 1983, vol. 23, No. 18, pp. 1012-1018.

Manouras, et al., "High Sensitivity Resists for EUV Lithography: A Review of Material Design Strategies and Performance Results," MDPI, Nanomaterials, Aug. 14, 2020, pp. 1-24.

Stowers, "Direct Patterning of Solution Deposited Metal Oxides," An Abstract of Dissertation, Aug. 14, 2008, pp. 1-149.

Wagner, et al., "The Use of HBr in Polysilicon Etching," Gases & Instrumentation International, vol. 7, Issue 4, Jul./Aug. 2013, pp. 1-7.

"List of Reactive Gases," Aug. 23, 2019, https://sps-support. honeywell.com/s/article/List-of-reactive-gases.

Niibe, et al., "Competitive reactions of carbon deposition and oxidation on the surface of Mo/Si multilayer mirrors by EUV irradiation," SPIE Optics + Optoelectronics, 2009, pp. 1-8.

Krysak, et al., "Development of an Inorganic Nanoparticle Photoresist for EUV, E-beam and 193 nm Lithography," SPIE vol. 7972, 2011, pp. 79721C-1 through 79721C-6.

Cardineau, et al., "EUV resists based on tin-oxo clusters," SPIE vol. 9051, 2014, pp. 90511B-1 through 90511B-12.

Buitrago, et al., "SnOx high-efficiency EUV interference lithography gratings towards the ultimate resolution in photolithography," Elsevier, 2016, pp. 44-49.

Preliminary Report on Patentability for Patent Application No. PCT/US2021/038758 dated Jan. 12, 2023, 6 pgs.

International Search Report and Written Opinion from International Patent Application No. PCT/US2021/038758 dated Oct. 15, 2021, 10 pgs.

Notice of Reasons for Rejection from Japanese Patent Application No. 2022-580825 dated Jan. 23, 2024, 8 pgs.

Non-Final Office Action from U.S. Appl. No. 18/198,743 dated Dec. 5, 2023, 28 pgs.

Official Letter from Taiwan Patent Application No. 112128099 dated Sep. 22, 2023, 7 pgs.

Official Letter from Taiwan Patent Application No. 110124241 dated Mar. 28, 2023, 10 pgs.

International Search Report and Written Opinion from International Patent Application No. PCT/US2021/038424 dated Oct. 14, 2021, 9 pgs.

Non-Final Office Action from U.S. Appl. No. 17/348,589 dated Jul. 28, 2022, 11 pgs.

International Preliminary Report on Patentability from PCT/US2021/038424 dated Jan. 12, 2023, 6 pgs.

Non-Final Office Action from U.S. Appl. No. 18/116,556 dated Aug. 1, 2023, 9 pgs.

Non-Final Office Action from U.S. Appl. No. 18/116,556 dated Dec. 5, 2023, 25 pgs.

Notice of Reasons for Rejection from Japanese Patent Application No. 2022-580826 dated Feb. 26, 2024, 8 pgs.

International Preliminary Report on Patentability from PCT/US2024/026513 dated Dec. 11, 2025, 6 pgs.

Weidman, et al., "Applications of Plasma Polymerized Methylsilane as a Resist and Silicon Dioxide Precursor for 193 and 248 nm Lithography," SPIE vol. 2438, Jun. 9, 1995, 9 pgs.

Official Letter from Taiwan Patent Application No. 113116953 mailed Mar. 19, 2026, 10 pgs.

Weidman, et al., "Applications of Plasma Polymerized Methylsilane as a Resist and Silicon Dioxide Precursor for 193 and 248 nm Lithography," Advances in Resist Technology and Processing XII, SPIE's 1995 Symposium on Microlithography, Proceedings vol. 2438, Jun. 9, 1995, 9 pgs.

* cited by examiner

220

START

PLACE SUBSTRATE ON LIFT PINS IN RAISED POSITION        222

LOWER LIFT PINS TO TRANSFER SUBSTRATE TO ESC        224

APPLY CLAMPING VOLTAGE TO ESC        226

SUBSTRATE CLAMPED        228

FINISH

<u>240</u>

START

TURN OFF CLAMPING VOLTAGE TO ESC — 242

SUBSTRATE UNCLAMPED — 244

RAISE PINS TO LIFT SUBSTRATE FROM ESC — 246

FINISH

APPARATUS FOR CLAMPING A SUBSTRATE ON A MONO-POLAR ELECTROSTATIC CHUCK FOR DEPOSITION OF PHOTORESIST FILMS

CROSS-REFERENCE TO RELATED APPLICATIONS

This application claims the benefit of U.S. Provisional Application No. 63/470,088, filed on May 31, 2023, the entire contents of which are hereby incorporated by reference herein.

BACKGROUND

1) Field

Embodiments of the present disclosure pertain to the field of semiconductor processing and, in particular, to an apparatus for clamping a substrate on a mono-polar electrostatic chuck for deposition of photoresist films.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (etched). The photoresist is then developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include an apparatus for clamping a substrate on a mono-polar electrostatic chuck for deposition of photoresist films.

In an embodiment, a lift-pin assembly includes a first metal spring, a first metal above and coupled to the first metal spring, a second metal spring above and coupled to the first metal, a second metal above and coupled to the second metal spring, and a ceramic above and coupled to the second metal.

In an embodiment, a mono-polar electrostatic chuck includes a chuck body, a plurality of lift-pin holes in the chuck body, and a plurality of lift-pins, individual ones of the plurality of lift-pins in corresponding ones of the plurality of lift-pin holes. Each of the plurality of lift-pins includes a first metal spring, a first metal above and coupled to the first metal spring, a second metal spring above and coupled to the first metal, a second metal above and coupled to the second metal spring, and a ceramic above and coupled to the second metal.

In an embodiment, a system includes a chamber, a plasma source within or coupled to the chamber, and a mono-polar electrostatic chuck within the chamber. The mono-polar electrostatic chuck includes a chuck body, a plurality of lift-pin holes in the chuck body, and a plurality of lift-pins, individual ones of the plurality of lift-pins in corresponding ones of the plurality of lift-pin holes. Each of the plurality of lift-pins includes a first metal spring, a first metal above and coupled to the first metal spring, a second metal spring above and coupled to the first metal, a second metal above and coupled to the second metal spring, and a ceramic above and coupled to the second metal.

DETAILED DESCRIPTION

Figure 1:
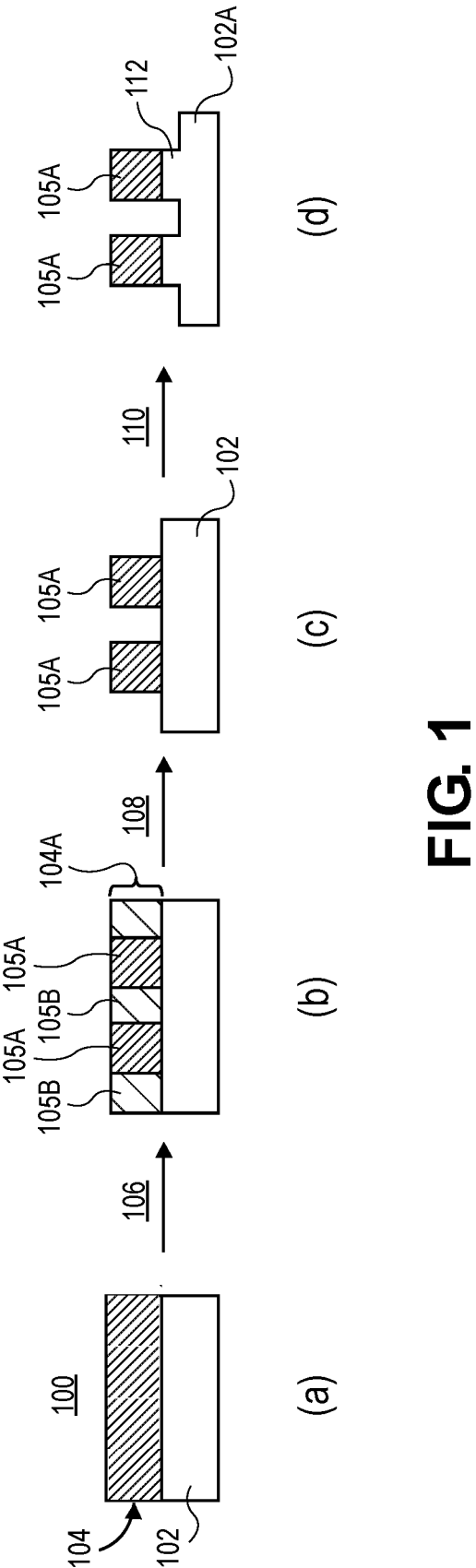
FIG. 1 illustrates cross-sectional views representing various operations in a patterning process using a positive tone photo-resist material formed by processes described herein, in accordance with an embodiment of the present disclosure.

Apparatuses for clamping a substrate on a mono-polar electrostatic chuck for deposition of photoresist films are described herein. In the following description, numerous specific details are set forth, such as chemical vapor deposition (CVD) and atomic layer deposition (ALD) processes and material regimes for depositing a photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, monopolar electrostatic chucks (ESCs) use plasma on top of wafer to chuck dechuck wafers. In accordance with embodiments described herein, chucking and dechucking of a wafer is performed via touching the wafer by a lift pin mechanism. This allows electrical circuit to complete with high voltage ESC power supply, ESC, wafer and lift pin mechanism for direct charge transfer in optimal time.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Traditionally, carbon based films called organic chemically amplified photoresists (CAR) have been used as a photoresist. However, more recently organic-inorganic hybrid materials (metal-oxo) have been used as a photoresist with extreme ultraviolet (EUV) radiation. Such materials typically include a metal (such as Sn, Hf, Zr), oxygen, and carbon. Transformation from deep UV (DUV) to EUV in the lithographic industry facilitated narrow features with high aspect ratio. Metal-oxo based organic-inorganic hybrid materials have been shown to exhibit lower line edge roughness (LER) and higher resolution which are required for forming narrow features. Also, such films have higher sensitivity and etch resistance properties and can be implemented to fabricate relatively thinner films.

Currently, a metal-oxo photoresist is deposited by spin-on methods which includes wet chemistries. Post bake processes are required to drive off any remaining solvents from the film and to render the film stable. Also, wet methods can generate a lot of wet waste that the industry wants to move away from. Photoresist films deposited by spin-on methods often result in non-uniformity issues. In accordance with embodiments of the present disclosure, addressing one or more of the above issues, apparatuses and processes for vacuum deposition of a metal-oxo photoresist are described herein.

In accordance with one or more embodiments of the present disclosure, an apparatus for clamping a substrate on mono-polar electrostatic chucks is described herein. In an embodiment, dry deposition and oxidation treatment approaches for forming photoresist films on a mono-polar electrostatic chuck are described herein. In some embodiments, thermal chemical vapor deposition (CVD) on a mono-polar electrostatic chuck is used for dry deposition of a photoresist film. In other embodiments, plasma enhanced chemical vapor deposition (PECVD) on a mono-polar electrostatic chuck is used for dry deposition of a photoresist film. In an embodiment, the dry deposition process is not a condensation process. In another embodiment, the dry deposition process is a condensation process. In one such condensation process embodiment, a wafer/substrate is maintained at a temperature at which the metal precursor can be condensed. Precursor condensation can be achieved by maintaining the wafer temperature on a mono-polar electrostatic chuck at a lower temperature than a precursor ampoule temperature.

FIG. 1 illustrates cross-sectional views representing various operations in a patterning process using a positive tone photo-resist material formed by processes described herein, in accordance with an embodiment of the present disclosure.

Referring to part (a) of FIG. 1, a starting structure 100 includes a positive tone photoresist layer 104 above a substrate or underlying layer 102. In one embodiment, the positive tone photoresist layer 104 is deposited using dry deposition. Referring to part (b) of FIG. 1, the starting structure 100 is irradiated 106 in select locations to form an irradiated photoresist layer 104A having irradiated regions 105B and non-irradiated regions 105A. Referring to part (c) of FIG. 1, a removal or etch process 108 is used to provide a developed photoresist layer of non-irradiated regions 105B. Referring to part (d) of FIG. 1, an etch process 110 using the non-irradiated regions 105B as a mask is used to pattern the substrate or underlying layer 102 to form patterned substrate or patterned underlying layer 102A including etched features 112.

Referring again to FIG. 1, the positive tone photoresist 104 is a radiation sensitive material and, upon irradiation, a chemical transformation occurs in the exposed part of the film which enables a change in solubility between exposed and non-exposed regions. Using the solubility change, exposed regions of the positive tone photoresist are removed (etched). The positive tone photoresist is then developed and the pattern can be transferred to the underlying thin film or substrate by etching. After the pattern is transferred, the residual positive tone photoresist is removed. The process can be repeated many times can fabricate 2D and 3D structures, e.g., for use in microelectronic devices. It is to be appreciated that other embodiments can involve the formation of negative tone resists.

In accordance with one or more embodiments of the present disclosure, an apparatus for clamping a substrate on mono-polar electrostatic chucks is described. Embodiments include substrate clamping on mono-polar chucks. In an embodiment, an approach is to ground the wafer through wafers lift pins to allow the wafer to be chucked on mono-polar chucks in the absence of plasma or other external grounding apparatus.

To provide context, electrostatic chucks rely on creating a potential difference between two surfaces (acting as electrodes) to generate a clamping force on the substrate. The potential difference is usually generated by applying opposite polarities to electrodes within the electrostatic chuck (bi-polar chuck), or by applying only one polarity to the electrostatic chuck (mono-polar chuck) and grounding the wafer through another apparatus (edge ring, plasma, etc.).

In accordance with one or more embodiments of the present disclosure, approaches described herein eliminate the need for an additional apparatus for grounding the substrate by adding electrical-conduction and corrosion-resistance capability to the substrate lift pins. In an embodiment, an approach involves controlling the contact between the wafer and the lift pins and to connect/disconnect the contact as required for various applications. Embodiments can be directed to electrostatic chucks, substrate clamping, mono-polar chucks, and/or wafer lift pins.

In accordance with an embodiment of the present disclosure, an additional spring between each wafer lift pin and a lift gripper mechanism is included to ensure a consistent ground path while providing compliance to the linear motion of the pins. In one embodiment, the apparatus provides a ground path for the wafer through the wafer lift assembly. Embodiments can be implemented to be resistant to corrosion and particle generation from exposure to plasma and wafer contact.

In accordance with an embodiment of the present disclosure, the need for the additional apparatus for grounding a substrate is eliminated by adding electrical-conduction and corrosion-resistance capability to the substrate lift pins. In one embodiment, these pin assemblies have built-in compliance to ensure constant contact with the backside of the substrate and provide the desired contact pressure to achieve electrical conduction. In one embodiment, the above apparatus, in combination with a mono-polar electrostatic chuck, provides the force required to clamp a substrate.

One or more embodiments are directed to a multi-material corrosion resistant assembly with electrically conductive interfaces. One or more embodiments are directed to a compliant assembly to ensure constant contact with substrate and guided linear motion to enable accurate and repeatable substrate handling. One or more embodiments are directed to a compliant apparatus to provide a contact pressure to achieve electrical conduction between a wafer and a lift assembly.

Figure 2A:
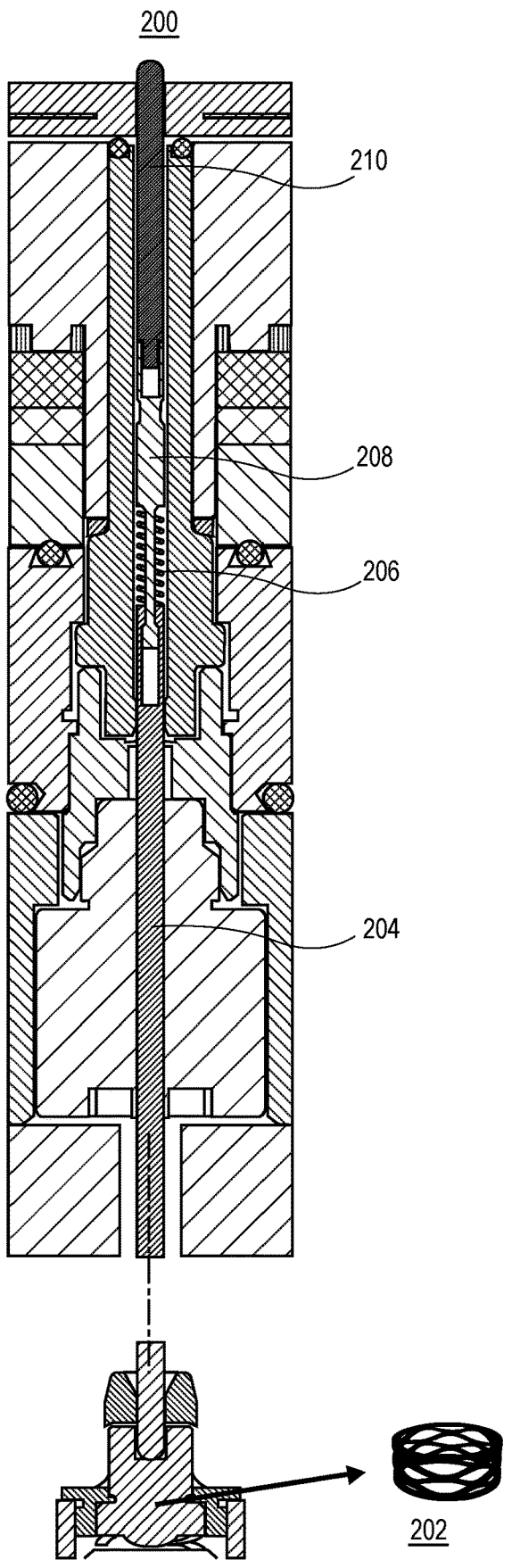
FIG. 2A illustrates a lift pin assembly, in accordance with an embodiment of the present disclosure.

As an exemplary apparatus, FIG. 2A illustrates a lift pin assembly, in accordance with an embodiment of the present disclosure.

Referring to FIG. 2A, a lift pin assembly 200 includes a metal spring 202. The metal spring 202 can be included for conducting electricity. The metal spring 202 can provide a consistent ground path. The metal spring 202 can provide compliance. The metal spring 202 can be electrically conductive. The metal spring 202 can provide guided linear motion.

Referring again to FIG. 2A, the lift pin assembly 200 includes a metal 204. The metal 204 can be included for conducting electricity, interfacing with the spring 202, interfacing with a metal pin, and/or interfacing with a gripper in the lift assembly. The metal 204 can be electrically conductive. The metal 204 can provide guided linear motion.

Referring again to FIG. 2A, the lift pin assembly 200 includes a metal spring 206. The metal spring 206 can be included for conducting electricity. The metal spring 206 can be included to provide compliance. The metal spring 206 can be included to provide back pressure. The metal spring 206 can be electrically conductive. The metal spring 206 can provide contact pressure.

Referring again to FIG. 2A, the lift pin assembly 200 includes a metal 208. The metal 208 can be included for conducting electricity, to guide/support the spring, and/or to interface with a metal pin for linear guidance. The metal 208 can be electrically conductive. The metal 208 can provide guided linear motion.

Referring again to FIG. 2A, the lift pin assembly 200 includes a ceramic 210, such as SiC. The ceramic 210 can be included for conducting supporting a wafer and/or conducting electricity. The ceramic 210 can be resistant to corrosion. The ceramic 210 can be electrically conductive. In another embodiments, a metal can be used in place of the ceramic.

One or more embodiments described herein can be implemented to provide chucking capability to a mono-polar electrostatic chuck (ESC) by providing a ground path to the wafer via the wafer lift pins. The contact between the wafer and the lift pins can be controlled, and connect/disconnect of the contact can be implemented as required for various applications. In an embodiment, an additional spring is included between the wafer lift pins and the lift gripper mechanism to ensure a consistent ground path while providing compliance to the linear motion of the pins. Embodiments can be implemented to provide a ground path for the wafer through the wafer lift assembly. Materials and surfaces exposed to process environment can be resistant to corrosion and resistant to particle generation from exposure to plasma and contact with the wafer.

Figure 2B:
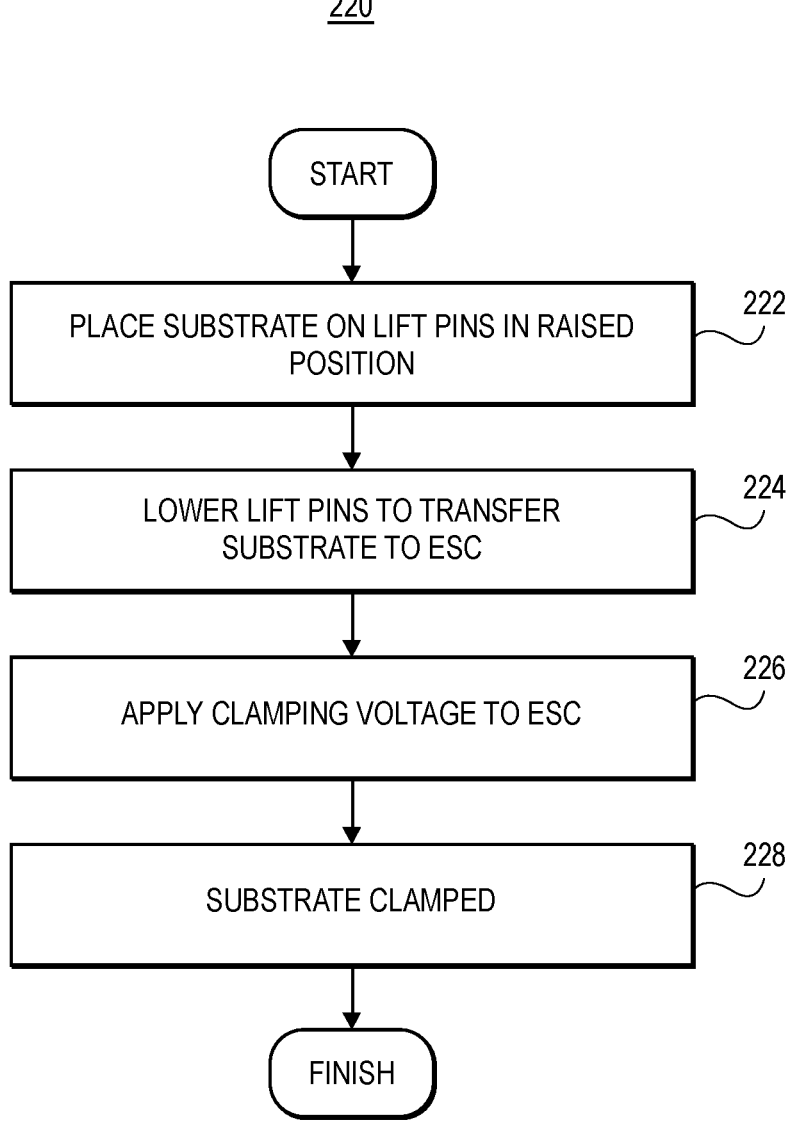
FIG. 2B is a flowchart of operations in a method of chucking a wafer, in accordance with an embodiment of the present disclosure.

FIG. 2B is a flowchart 220 of operations in a method of chucking a wafer, in accordance with an embodiment of the present disclosure. Referring to operation 222, a substrate is placed on lift pins, such as lift pins of the type 200 of FIG. 2A, in a raised position. Referring to operation 224, the lift pins are lowered to transfer the substrate to an electrostatic chuck. Referring to operation 226, a clamping voltage is applied to the electrostatic chuck. Referring to operation 228, the substrate is clamped.

Figure 2C:
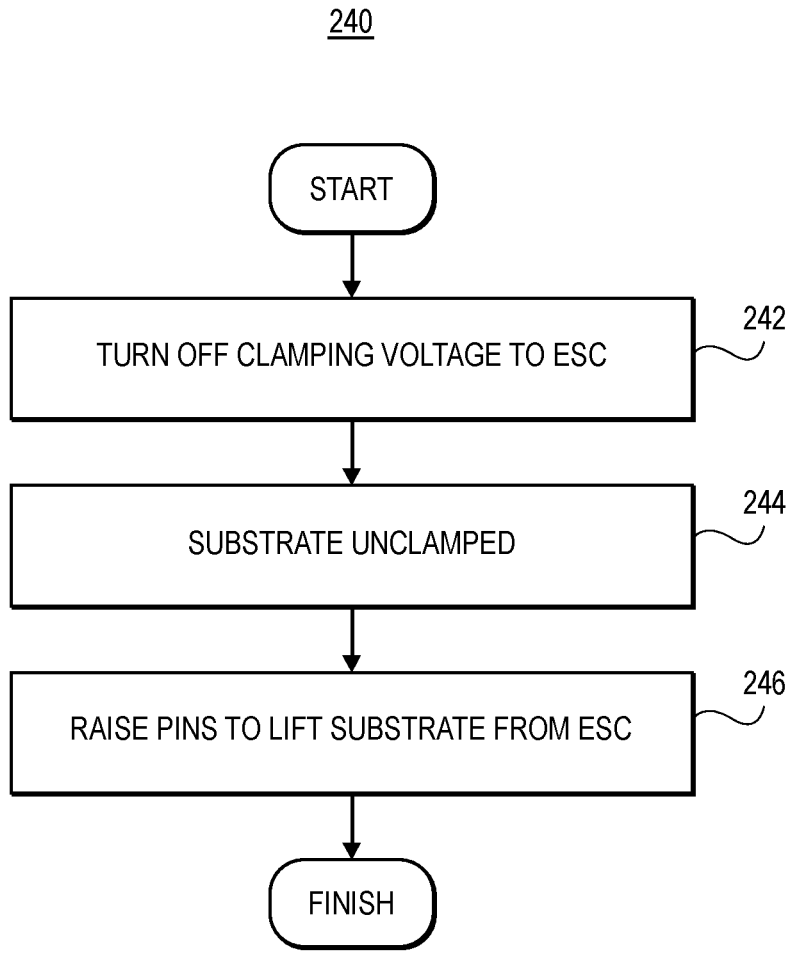
FIG. 2C is a flowchart of operations in a method of de-chucking a wafer, in accordance with an embodiment of the present disclosure.

FIG. 2C is a flowchart 240 of operations in a method of de-chucking a wafer, in accordance with an embodiment of the present disclosure. Referring to operation 242, the clamping voltage to the electrostatic chuck is turned off. Referring to operation 244, the substrate is unclamped. Referring to operation 246, the lift pins are raised to lift the substrate from the electrostatic chuck.

Advantages for implementing embodiments described herein can include elimination of the need for an additional apparatus to clamp a wafer on a mono-polar electrostatic chuck. The corrosion resistant capability of embodiments described herein enables its use in all semiconductor wafer fabrication equipment that uses electrostatic chucking.

In another aspect, in an embodiment, Sn precursors are used for vacuum deposition processes of Sn oxo PR materials. An SnOC film can be an attractive photoresist film due to its high sensitivity to exposure. In general, tin-oxo photoresist films contain Sn—O and Sn—C bonds in the SnOC network and, upon exposure (such as UV/EUV), Sn—C bond breaks and carbon percentage is reduced in the film. This can lead to the selective etch during the develop process. Sn—C can be incorporated into the film by using a metal precursor with Sn—C bond(s). In one embodiment, precursors described herein have Sn—C(R contains C that is bound to Sn) for exposure sensitivity and have ligands (L) to react with an oxidant (water as an example) to form a photoresist film. In one embodiment, reactivity between the precursor and oxidant can be modulated by changing the R and/or L on the Sn precursor. Also, the sensitivity can be modulated by changing the R group in the precursor. In one embodiment, indium-oxo or tin-indium-oxo films can also be used as photoresist films. Approaches described herein can be extended to many other metal-containing films.

In accordance with an embodiment of the present disclosure, a photoresist is fabricated by using a particular type of R group in the metal precursor or plasma assisted deposition methods. As an example, a phenyl group (R) containing Sn precursor (PhSn(NMe$_2$)$_3$) can be used. After exposing the resist to UV under ambient, the exposed region showed an acid moiety by FTIR. Then, the resist was dipped in aqueous sodium hydroxide (NaOH) and the resist was developed. The acidic part of the resist (exposed region) reacts with basic NaOH and dissolves in aqueous medium resulting in a positive tone resist. Also, when $Sn(nBu)_4$ was used in PECVD, positive tone resist was obtained. Thus, approaches for fabricating a positive tone photoresist are described herein. However, in other embodiments, a negative tone photoresist can be fabricated.

In an embodiment, R groups with low radical stability are used. For example, radicals of R groups such as phenyl, alkenyl, methyl have low stability ($Sn—C→Sn·+C·$). In an embodiment, for an exposure environment, when the photoresist is exposed by an energy source (e.g., EUV) the exposure chamber (environment) can be oxygen-containing or inert. In one embodiment, exposure is under vacuum with an oxygen source such as $O_2$, $H_2O$, $CO_2$, CO, $NO_2$, or NO. A repetition of EUV exposure and then oxygen exposure can be, in one embodiment, between 1 and 100 times.

In an embodiment, post anneal is performed in an oxygen-containing environment. In one embodiment, the oxygen source is $O_3$, $NO_2$, NO or $O_2$, which can be used to form a plasma, and/or which can be used along with $N_2$, Ar or He. In one embodiment, the post anneal is performed at a temperature in the range of 25-200 degrees Celsius. In one embodiment, the post anneal is performed at a pressure of less than 200 torr. In a particular embodiment, the post anneal is performed using ozone ($O_3$) as an oxygen source gas, at a temperature in the range of 25-250 degrees Celsius, at a pressure less than 200 torr.

In an embodiment, basic developers that can be used include inorganic bases that can be prepared in water and the concentration and develop time can be adjusted. In one embodiment, group 1 and 2 hydroxides (e.g., NaOH, KOH), $NH_4OH$, $NaHCO_3$, $NaCO_3$, $N(CH_3)_4OH$, or other amines.

In an embodiment, an oxidant co-reactant is selected from the group consisting of water, $O_2$, $N_2O$, NO, $CO_2$, CO, ethylene glycol, alcohols (e.g., methanol, ethanol), peroxides (e.g., $H_2O_2$), and acids (e.g., formic acid, acetic acid).

In a first approach, in accordance with an embodiment of the present disclosure, a chemical vapor deposition (CVD) method for forming a photoresist includes: (A) One or more metal precursors and one or more oxidants listed above are vaporized to a vacuum chamber where a substrate wafer is maintained at a pre-determined substrate temperature. Substrate temperature can vary from 0° C. to 500° C. When the precursors/oxidants are vaporized to the chamber, they can be diluted with inert gases such as Ar, $N_2$, He. Due to the reactivity of the precursor and oxidant, metal-oxo film is deposited on the wafer. Vaporization to the chamber can be performed by all precursors simultaneously or alternative pulsing of metal precursor(s) and oxidant(s). This process can be described as thermal CVD. (B) Plasma can be turned on during this process as well, and then the process can be described as plasma enhanced (PE)-CVD. Examples of plasma sources are CCP, ICP, remote plasma, microwave plasma. (C) Photoresist film deposition can be performed by thermal deposition followed by plasma treatment. In this case, film is deposited thermally and then a plasma treatment operation is performed. Plasma treatment may involve plasma from inert gasses such as Ar, $N_2$, He or those gasses can be mixed with $O_2$, $CO_2$, CO, NO, $NO_2$, $H_2O$. The processes can be carried out as in cyclic fashion; thermal deposition followed by plasma treatment and repeat this cycle or complete the deposition part and then do one plasma treatment (post treatment). PECVD followed by plasma treatment is also possible. In either case, in an embodiment, a post anneal in an oxygen-containing environment is performed. In one embodiment, the post anneal is performed using ozone ($O_3$) as an oxygen source gas, at a temperature in the range of 25-250 degrees Celsius, at a pressure less than 200 torr.

In a second approach, in accordance with an embodiment of the present disclosure, an atomic layer deposition (ALD) method for forming a photoresist includes: (A) A metal precursor is vaporized to an vacuum chamber where a substrate wafer is maintained at a pre-determined substrate temperature. Substrate temperature can vary from 500° C. Then, an inert gas purge is provided to remove by-products and excess metal precursor. Then, one or more oxidant is vaporized to the chamber. The oxidant(s) react with surface absorbed metal precursor. Then, an inert gas purge is applied to remove the by-products and unreacted oxidant. This cycle can be repeated to get to the desired thickness. When the precursor or oxidant is vaporized to the chamber, it can be diluted with inert gases such as Ar, $N_2$, He. This process can be described as thermal ALD. Using this method more than one metal can be incorporated into the film by incorporating additional metal precursor pulses to a ALD cycle. Also, a different oxidant can be pulsed after the first oxidant. (B) A plasma can be turned on during the oxidant pulse and then the process can be described as PE-ALD. (C) Also, the deposition can be performed by thermal ALD followed by plasma treatment. In this case, film is deposited by thermally and then a plasma treatment operation is carried out. Plasma treatment may involve plasma from inert gasses such as Ar, $N_2$, He or those gasses can be mixed with $O_2$, $CO_2$, CO, NO, $NO_2$, $H_2O$. The processes can be performed as in cyclic fashion; X number of thermal ALD cycles (X=1-5000) followed by plasma treatment and repeat the whole cycle for desired number of times, or complete the deposition part and then do one plasma treatment. PE-ALD followed by plasma treatment is also possible. In either case, in an embodiment, a post anneal in an oxygen-containing environment is performed. In one embodiment, the post anneal is performed using ozone ($O_3$) as an oxygen source gas, at a temperature in the range of 25-250 degrees Celsius, at a pressure less than 200 torr.

In a third approach, in accordance with an embodiment of the present disclosure, an atomic layer deposition (ALD) or chemical vapor deposition (CVD) method for forming a photoresist includes providing a composition gradient throughout the film. As an example, the first few nanometers of the film have a different composition than the rest of the film. The main portion of the film can be optimized for dose, but target a different composition close to the interface layer to change adhesion, sensitivity to EUV photons, sensitivity to develop chemistry in order to improve post lithography profile control (especially scumming) as well as defectivity and resist collapse/lift off. The gradation might be optimized for pattern type, for example pillars needing improved adhesion vs line/space patterns being able to lower adhesion for improvements in dose.

In an embodiment, photoresist film deposition methods described here are vacuum deposition methods that do not involve wet chemistry. Advantages to implementing one or more of the approaches described herein include that the photoresist film deposition approaches are dry deposition approaches and do not involve wet chemistry. Wet chemistry methods can generate a substantial amount of wet by-products which may be preferable to avoid. Also, spin-on (wet methods) often lead to non-uniformity issues which can be successfully addressed by vacuum deposition methods described herein. Also, the percentage of metal and carbon (C) in the film can be tuned by vacuum deposition method.

In spin-on, metal percentage and C are often fixed in a given deposition system. Precursors used for depositing photoresist films under vacuum need to be volatile, and the precursors described herein are volatile based on L and R structure. Dry deposition methods may require lower temperatures than other vacuum deposition methods such as ALD or CVD. When the deposition is performed at low temperatures, relatively higher amounts of carbon can be retained in the film, which can be helpful in patterning.

In an embodiment, a vacuum deposition process relies on chemical reactions between a metal precursor and an oxidant. The metal precursor and the oxidant are vaporized to a vacuum chamber. In some embodiments, the metal precursor and the oxidant are provided to the vacuum chamber together. In other embodiments, the metal precursor and the oxidant are provided to the vacuum chamber with alternating pulses. After a metal-oxo photoresist film with a desired thickness is formed, the process may be halted. In an embodiment, an optional plasma treatment operation may be executed after a metal-oxo photoresist film with a desired thickness is formed.

In an embodiment, a cycle including a pulse of the metal precursor vapor and a pulse of the oxidant vapor may be repeated a plurality of times to provide a metal-oxo photoresist film with a desired thickness. In an embodiment, the order of the cycle may be switched. For example, the oxidant vapor may be pulsed first and the metal precursor vapor may be pulsed second. In an embodiment, a pulse duration of the metal precursor vapor may be substantially similar to a pulse duration of the oxidant vapor. In other embodiments, the pulse duration of the metal precursor vapor may be different than the pulse duration of the oxidant vapor. In an embodiment, the pulse durations may be between 0 seconds and 1 minute. In a particular embodiment, the pulse durations may be between 1 second and 5 seconds. In an embodiment, each iteration of the cycle uses the same processing gasses. In other embodiments, the processing gasses may be changed between cycles. For example, a first cycle may utilize a first metal precursor vapor, and a second cycle may utilize a second metal precursor vapor. Subsequent cycles may continue alternating between the first metal precursor vapor and the second metal precursor vapor. In an embodiment, multiple oxidant vapors may be alternated between cycles in a similar fashion. In an embodiment, an optional plasma treatment of operation may be executed after every cycle. That is, each cycle may include a pulse of metal precursor vapor, a pulse of oxidant vapor, and a plasma treatment. In an alternate embodiment, an optional plasma treatment of operation may be executed after a plurality of cycles. In yet another embodiment, an optional plasma treatment operation may be executed after the completion of all cycles (i.e., as a post treatment).

Providing metal-oxo photoresist films using dry deposition and oxidation treatment processes such as described in the embodiments above can achieve significant advantages over wet chemistry methods. One such advantage is the elimination of wet byproducts. With a dry deposition process, liquid waste is eliminated and byproduct removal is simplified. Additionally, dry deposition processes can provide a more uniform photoresist layer. Uniformity in this sense may refer to thickness uniformity across the wafer and/or uniformity of the distribution of metal components of the metal-oxo film.

Additionally, the use of dry deposition processes provides the ability to fine-tune the percentage of metal in the photoresist and the composition of the metal in the photoresist. The percentage of the metal may be modified by increasing/decreasing the flow rate of the metal precursor into the vacuum chamber and/or by modifying the pulse lengths of the metal precursor/oxidant. The use of a dry deposition process also allows for the inclusion of multiple different metals into the metal-oxo film. For example, a single pulse flowing two different metal precursors may be used, or alternating pulses of two different metal precursors may be used.

Furthermore, it has been shown that metal-oxo photoresists that are formed using dry deposition processes are more resistant to thickness reduction after exposure. It is believed, without being tied to a particular mechanism, that the resistance to thickness reduction is attributable, at least in part, to the reduction of carbon loss upon exposure.

Figure 3:
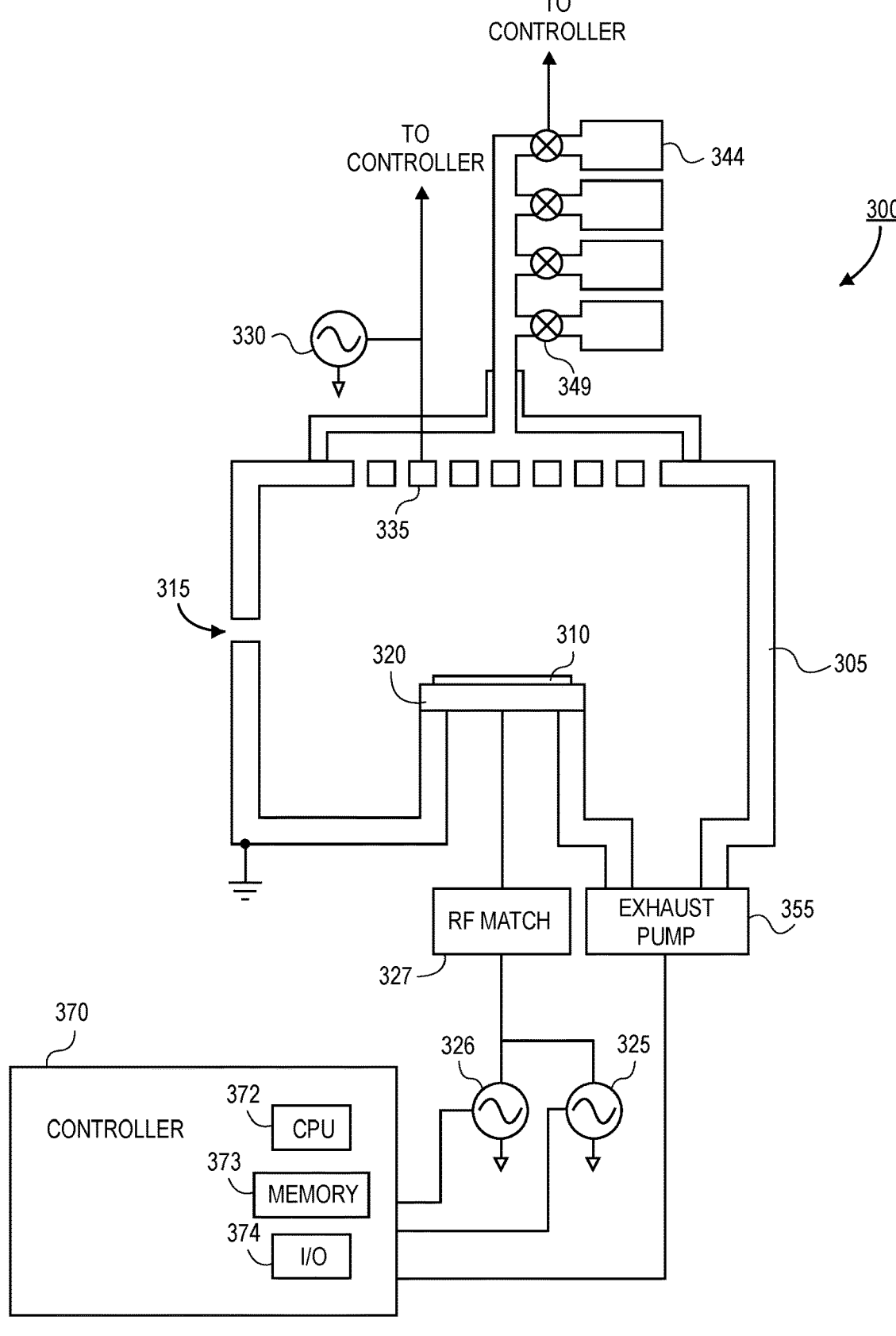
FIG. 3 is a cross-sectional illustration of a processing tool that may be used to implement a dry deposition and oxidation treatment process described herein, in accordance with an embodiment of the present disclosure.

In an embodiment, a vacuum chamber utilized in a dry deposition process is any suitable chamber capable of providing a sub-atmospheric pressure. In an embodiment, the vacuum chamber may include temperature control features for controlling chamber wall temperatures and/or for controlling a temperature of the substrate. In an embodiment, the vacuum chamber may also include features for providing a plasma within the chamber. A more detailed description of a suitable vacuum chamber is provided below with respect to FIG. 3. FIG. 3 is a schematic of a vacuum chamber configured to perform a dry deposition of a metal-oxo photoresist, in accordance with an embodiment of the present disclosure. It is to be appreciated that the lift pin(s) described above in association with FIG. 2A can be implemented with the embodiments described below in association with FIG. 3.

Vacuum chamber 300 includes a grounded chamber 305. A substrate 310 is loaded through an opening 315 and clamped to a temperature controlled chuck 320. Although not depicted, the chuck 320 can include a chuck body having a plurality of lift-pins holes therein, and corresponding ones of a plurality of lift-pins the lift-pin holes. In an embodiment, the substrate 310 may be temperature controlled during a dry deposition process. For example, the temperature of the substrate 310 may be between approximately −40 degrees Celsius to 200 degrees Celsius. In a particular embodiment, the substrate 310 may be held to a temperature between room temperature and 150° C.

Process gases, are supplied from gas sources 344 through respective mass flow controllers 349 to the interior of the chamber 305. In certain embodiments, a gas distribution plate 335 provides for distribution of process gases 344, such as a metal precursor, an oxidant, and an inert gas. Chamber 305 is evacuated via an exhaust pump 355. In one embodiment, one or more of the process gases are contained/stored in one or more ampoules. In one embodiment, the dry deposition process is a chemical vapor condensation process, and the one or more ampoules are maintained at a temperature above the substrate temperature, such as at a temperature 25 degrees Celsius or greater than the substrate temperature.

When RF power is applied during processing of a substrate 310, a plasma is formed in chamber processing region over substrate 310. Bias power RF generator 325 is coupled to the temperature controlled chuck 320. Bias power RF generator 325 provides bias power, if desired, to energize the plasma. Bias power RF generator 325 may have a low frequency between about 2 MHz to 60 MHz for example, and in a particular embodiment, is in the 13.56 MHz band. In certain embodiments, the vacuum chamber 300 includes a third bias power RF generator 326 at a frequency at about the 2 MHz band which is connected to the same RF match 327 as bias power RF generator 325. Source power RF generator 330 is coupled through a match (not depicted) to a plasma generating element (e.g., gas distribution plate 335) to provide a source power to energize the plasma. Source RF generator 330 may have a frequency between 100 and 180 MHz, for example, and in a particular embodiment, is in the 162 MHz band. Because substrate diameters have progressed over time, from 150 mm, 200 mm, 300 mm, etc., it is common in the art to normalize the source and bias power of a plasma etch system to the substrate area.

The vacuum chamber 300 is controlled by controller 370. The controller 370 may include a CPU 372, a memory 373, and an I/O interface 374. The CPU 372 may execute processing operations within the vacuum chamber 300 in accordance with instructions stored in the memory 373. For example, one or more processes such as processes 120 and 440 described above may be executed in the vacuum chamber by the controller 370.

In another aspect, embodiments disclosed herein include a processing tool that includes an architecture that is particularly suitable for optimizing dry depositions. For example, the processing tool may include a pedestal for supporting a wafer that is temperature controlled. In some embodiments, a temperature of the pedestal may be maintained between approximately −40° C. and approximately 200° C. Additionally, an edge purge flow and shadow ring may be provided around a perimeter of the column on which the substrate is supported. The edge purge flow and shadow ring prevent the photoresist from depositing along the edge or backside of the wafer. In an embodiment, the pedestal may also provide any desired chucking architecture, such as, but not limited to vacuum chucking, monopolar chucking, or bipolar chucking, depending on the operating regime of the processing tool.

In some embodiments, the processing tool may be suitable for deposition processes without a plasma. Alternatively, the processing tool may include a plasma source to enable plasma enhanced operations. Furthermore, while embodiments disclosed herein are particularly suitable for the deposition of metal-oxo photoresists for EUV patterning, it is to be appreciated that embodiments are not limited to such configurations. For example, the processing tools described herein may be suitable for depositing any photoresist material for any regime of lithography using a dry deposition process.

Figure 4:
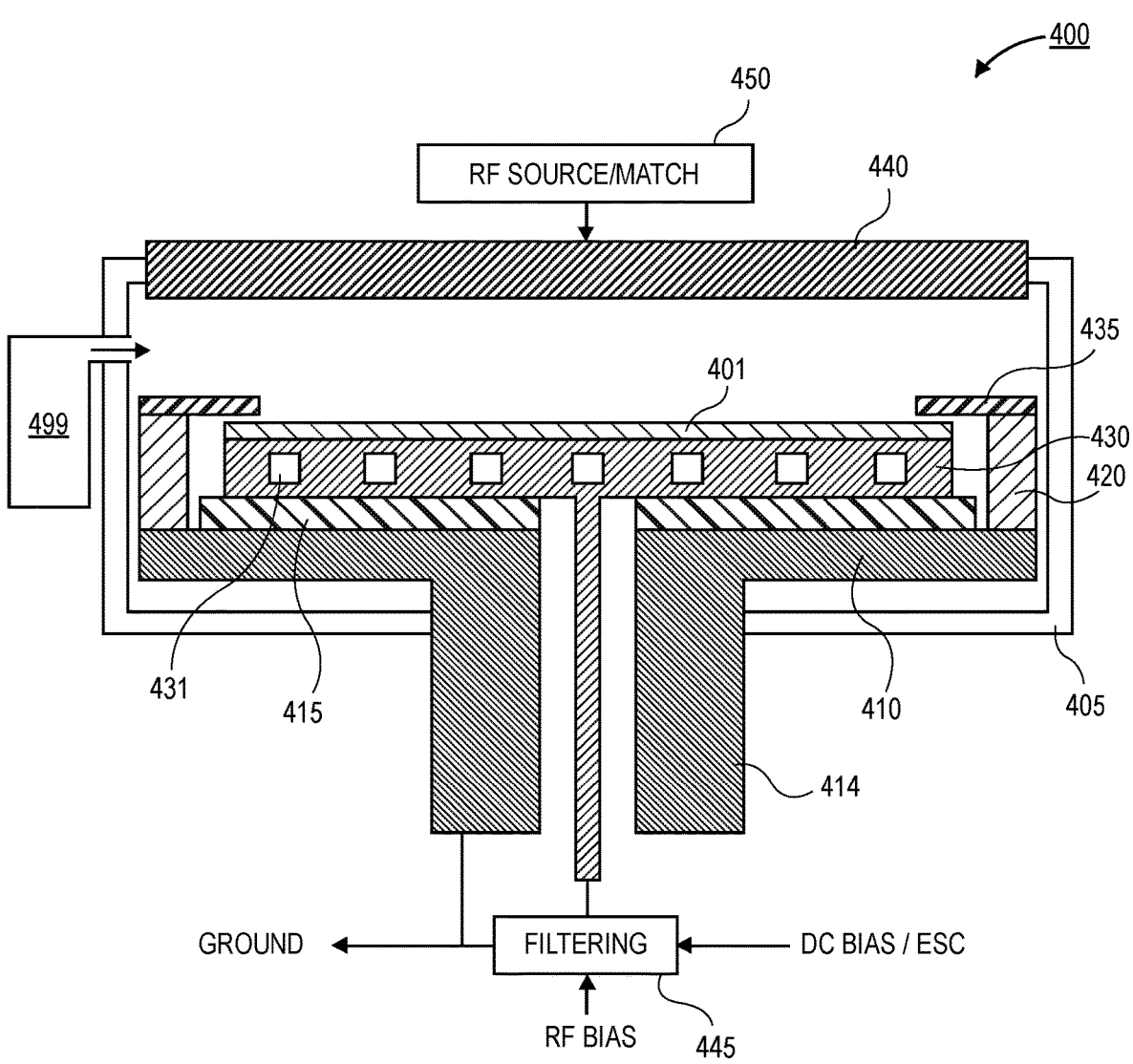
FIG. 4 is a cross-sectional illustration of a processing tool for depositing a photoresist layer over a substrate with a dry deposition and oxidation treatment process, in accordance with an embodiment of the present disclosure.

Referring now to FIG. 4, a cross-sectional illustration of a processing tool 400 is shown, in accordance with an embodiment. It is to be appreciated that the lift pin(s) described above in association with FIG. 2A can be implemented with the embodiments described below in association with FIG. 4. In an embodiment, the processing tool 400 may include a chamber 405. The chamber 405 may be any suitable chamber capable of supporting a sub-atmospheric pressure (e.g., a vacuum pressure). In an embodiment, an exhaust (not shown) that includes a vacuum pump may be coupled to the chamber 405 to provide a sub-atmospheric pressure. In an embodiment, a lid may seal the chamber 405. For example, the lid may include a showerhead assembly 440 or the like. The showerhead assembly 440 may include fluidic pathways to enable processing gasses and/or inert gasses to be flown into the chamber 405. In some embodiments where the processing tool 400 is suitable for plasma enhanced operation, the showerhead assembly 440 may be electrically coupled to an RF source and matching circuitry 450. In yet another embodiment, the tool 400 may be configured in an RF bottom fed architecture. That is, the pedestal 430 is connected to an RF source, and the showerhead assembly 440 is grounded. In such an embodiment, the filtering circuitry may still be connected to the pedestal. In one embodiment, a precursor gas is stored in an ampoule 499.

In an embodiment, a displaceable column for supporting a wafer 401 is provided in the chamber 405. In an embodiment, the wafer 401 may be any substrate on which a photoresist material is deposited. For example, the wafer 401 may be a 300 mm wafer or a 450 mm wafer, though other wafer diameters may also be used. Additionally, the wafer 401 may be replaced with a substrate that has a non-circular shape in some embodiments. The displaceable column may include a pillar 414 that extends out of the chamber 405. The pillar 414 may have a port to provide electrical and fluidic paths to various components of the column from outside the chamber 405.

In an embodiment, the column may include a baseplate 410. The baseplate 410 may be grounded. As will be described in greater detail below, the baseplate 410 may include fluidic channels to allow for the flow of an inert gas to provide an edge purge flow.

In an embodiment, an insulating layer 415 is disposed over the baseplate 410. The insulating layer 415 may be any suitable dielectric material. For example, the insulating layer 415 may be a ceramic plate or the like. In an embodiment, a pedestal 430 is disposed over the insulating layer 415. The pedestal 430 may include a single material or the pedestal 430 may be formed from different materials. In an embodiment, the pedestal 430 may utilize any suitable chucking system to secure the wafer 401. For example, the pedestal 430 may be a vacuum chuck or a monopolar chuck. Although not depicted, the pedestal can include a chuck body having a plurality of lift-pins holes therein, and corresponding ones of a plurality of lift-pins the lift-pin holes.

The pedestal 430 may include a plurality of cooling channels 431. The cooling channels 431 may be connected to a fluid input and a fluid output (not shown) that pass through the pillar 414. In an embodiment, the cooling channels 431 allow for the temperature of the wafer 401 to be controlled during operation of the processing tool 400. For example, the cooling channels 431 may allow for the temperature of the wafer 401 to be controlled to between approximately −40° C. and approximately 200° C. In an embodiment, the pedestal 430 connects to the ground through filtering circuitry 445, which enables DC and/or RF biasing of the pedestal with respect to the ground.

In an embodiment, an edge ring 420 surrounds a perimeter of the insulating layer 415 and the pedestal 430. The edge ring 420 may be a dielectric material, such as a ceramic. In an embodiment, the edge ring 420 is supported by the base plate 410. The edge ring 420 may support a shadow ring 435. The shadow ring 435 has an interior diameter that is smaller than a diameter of the wafer 401. As such, the shadow ring 435 blocks the photoresist from being deposited onto a portion of the outer edge of the wafer 401. A gap is provided between the shadow ring 435 and the wafer 401. The gap prevents the shadow ring 435 from contacting the wafer 401, and provides an outlet for the edge purge flow that will be described in greater detail below. In an embodiment, a dual channel showerhead can be used for a photoresist fabrication process.

While the shadow ring 435 provides some protection of the top surface and edge of the wafer 401, processing gasses may flow/diffuse down along a path between the edge ring 420 and the wafer 401. As such, embodiments disclosed herein may include a fluidic path between the edge ring 420 and the pedestal 430 to enable an edge purge flow. Providing an inert gas in the fluidic path increases the local pressure in the fluidic path and prevents processing gasses from reaching the edge of the wafer 401. Therefore, deposition of the photoresist is prevented along the edge of the wafer 401.

Figure 5:
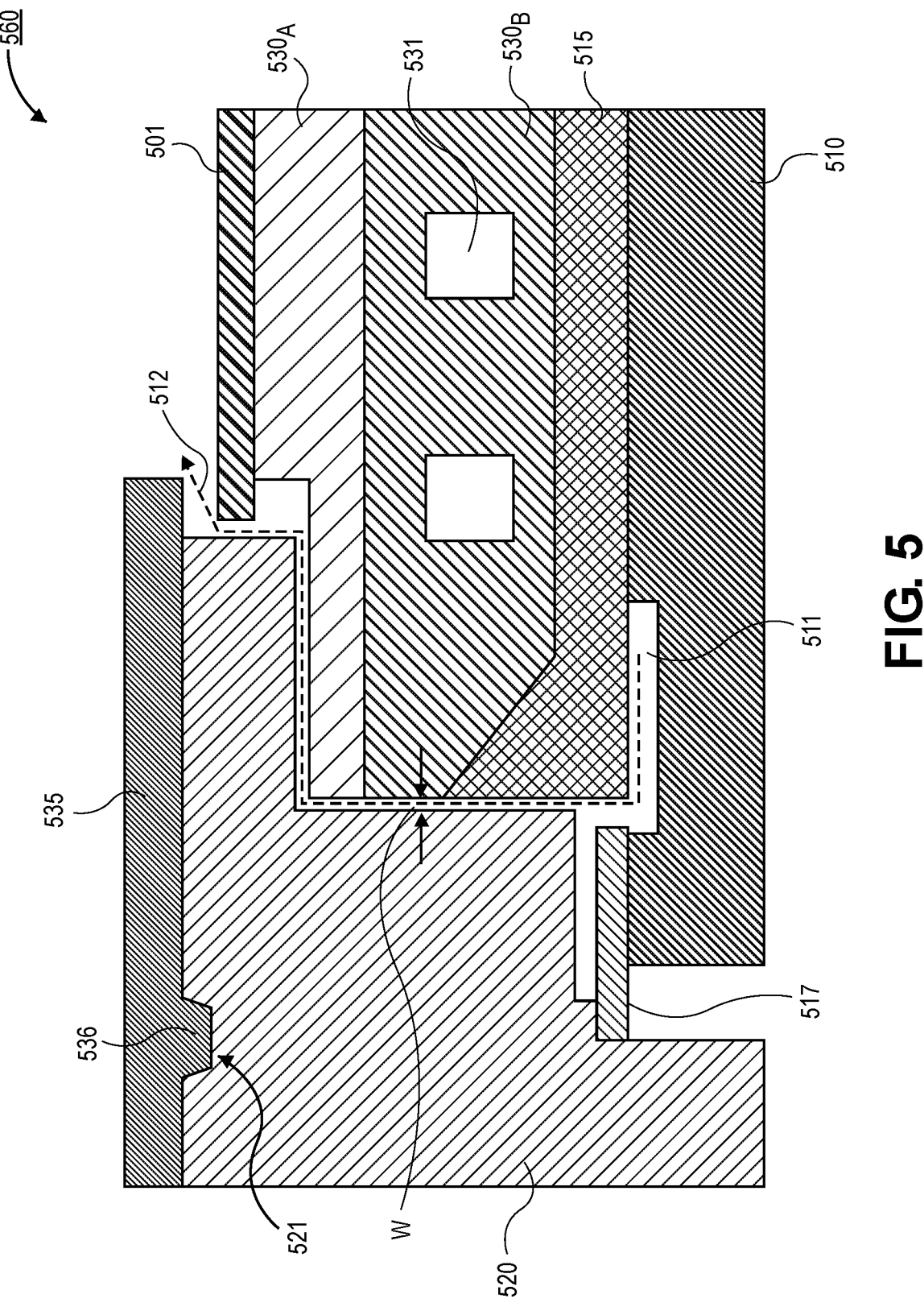
FIG. 5 is a zoomed in illustration of an edge of a displaceable column in a processing tool for depositing a photoresist layer over a substrate with a dry deposition and oxidation treatment process, in accordance with an embodiment of the present disclosure.

Referring now to FIG. 5, a zoomed in cross-sectional illustration of a portion of a column 560 within a processing tool is shown, in accordance with an embodiment. It is to be appreciated that the lift pin(s) described above in association with FIG. 2A can be implemented with the embodiments described below in association with FIG. 5. In FIG. 5, only the left edge of the column 560 is shown. However, it is to be appreciated that the right edge of the column 560 may substantially mirror the left edge.

In an embodiment, the column 560 may include a baseplate 510. An insulating layer 515 may be disposed over the baseplate 510. In an embodiment, the pedestal 530 may include a first portion 530A and a second portion 530B. The cooling channels 531 may be disposed in the second portion 530B. The first portion 530A may include features for chucking the wafer 501. Although not depicted, the first portion 530A can include a chuck body having a plurality of lift-pins holes therein, and corresponding ones of a plurality of lift-pins the lift-pin holes.

In an embodiment, an edge ring 520 surrounds the baseplate 510, the insulating layer 515, the pedestal 530, and the wafer 501. In an embodiment, the edge ring 520 is spaced away from the other components of the column 550 to provide a fluidic path 512 from the baseplate 510 to the topside of the column 560. For example, the fluidic path 512 may exit the column between the wafer 501 and shadow ring 535. In a particular embodiment, an interior surface of the fluidic path 512 includes an edge of the insulating layer 515, an edge of the pedestal 530 (i.e., the first portion 530A and the second portion 530B), and an edge of the wafer 501. In an embodiment, the outer surface of the fluidic path 512 includes an interior edge of the edge ring 520. In an embodiment, the fluidic path 512 may also continue over a top surface of a portion of the pedestal 530 as it progresses to the edge of the wafer 501. As such, when an inert gas (e.g., helium, argon, etc.) is flown through the fluidic path 512, processing gasses are prevented from flowing/diffusing down the side of the wafer 501.

In an embodiment, the width W of the fluidic path 512 is minimized in order to prevent the striking of a plasma along the fluidic path 512. For example, the width W of the fluidic path 512 may be approximately 1 mm or less. In an embodiment, a seal 517 blocks the fluidic path 512 from exiting the bottom of the column 560. The seal 517 may be positioned between the edge ring 520 and the baseplate 510. The seal 517 may be a flexible material, such as a gasket material or the like. In a particular embodiment, the seal 517 includes silicone.

In an embodiment, a channel 511 is disposed in the baseplate 510. The channel 511 routes an inert gas from the center of the column 560 to the interior edge of the edge ring 520. It is to be appreciated that only a portion of the channel 511 is illustrated in FIG. 5. A more comprehensive illustration of the channel 511 is provided below with respect to FIG. 7B.

In an embodiment, the edge ring 520 and the shadow ring 535 may have features suitable for aligning the shadow ring 535 with respect to the wafer 501. For example, a notch 521 in the top surface of the edge ring 520 may interface with a protrusion 536 on the bottom surface of the shadow ring 535. The notch 521 and protrusion 536 may have tapered surfaces to allow for coarse alignment of the two components to be sufficient to provide a more precise alignment as the edge ring 520 is brought into contact with the shadow ring 535. In an additional embodiment, an alignment feature (not shown) may also be provided between the pedestal 530 and the edge ring 520. The alignment feature between the pedestal 530 and the edge ring 520 may include a tapered notch and protrusion architecture similar to the alignment feature between the edge ring 520 and the shadow ring 535.

Figure 6A:
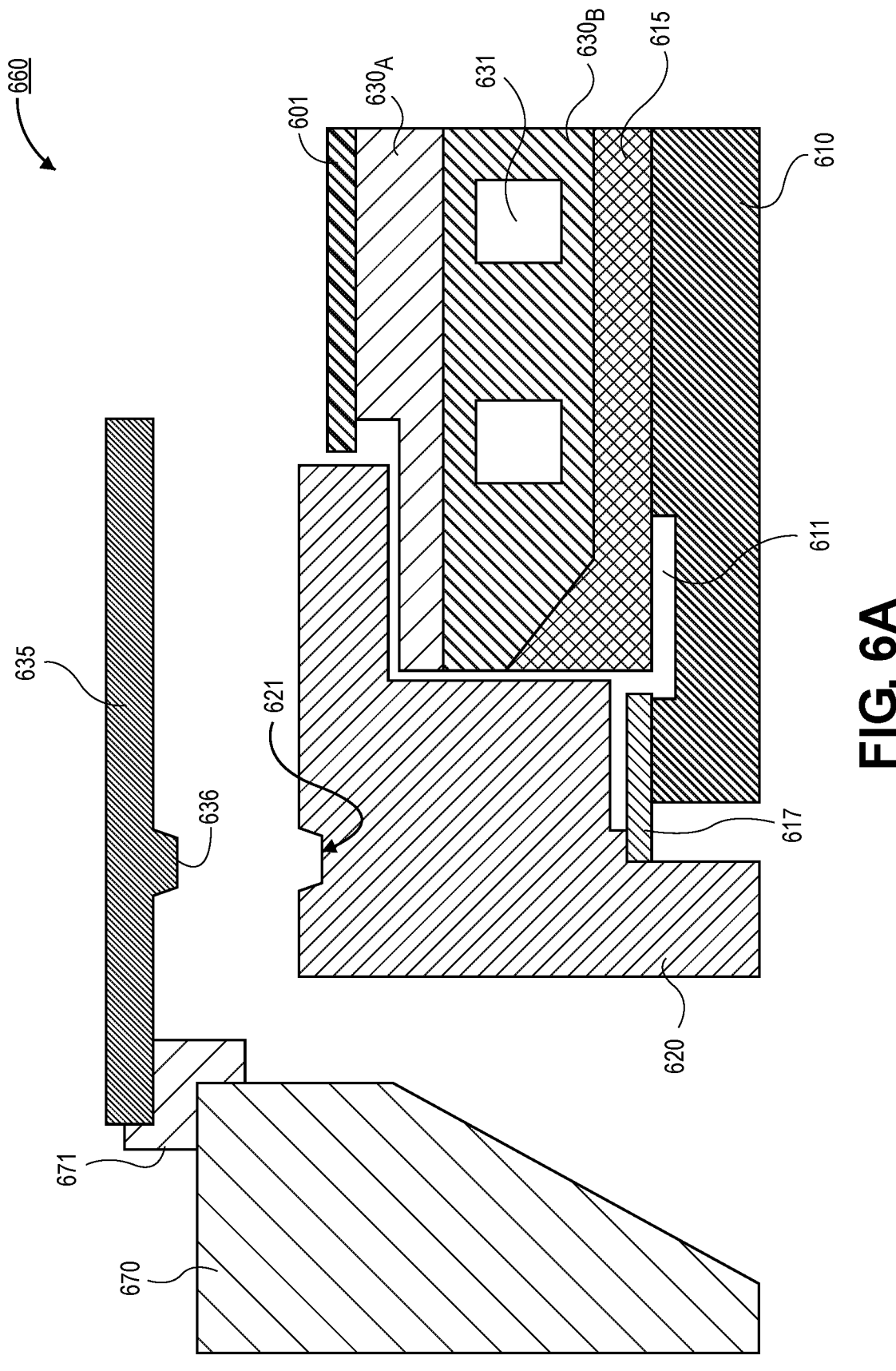
FIG. 6A is a zoomed in illustration of an edge of a displaceable column in a processing tool, where the shadow ring is not engaged with the edge ring, in accordance with an embodiment of the present disclosure.
Figure 6B:
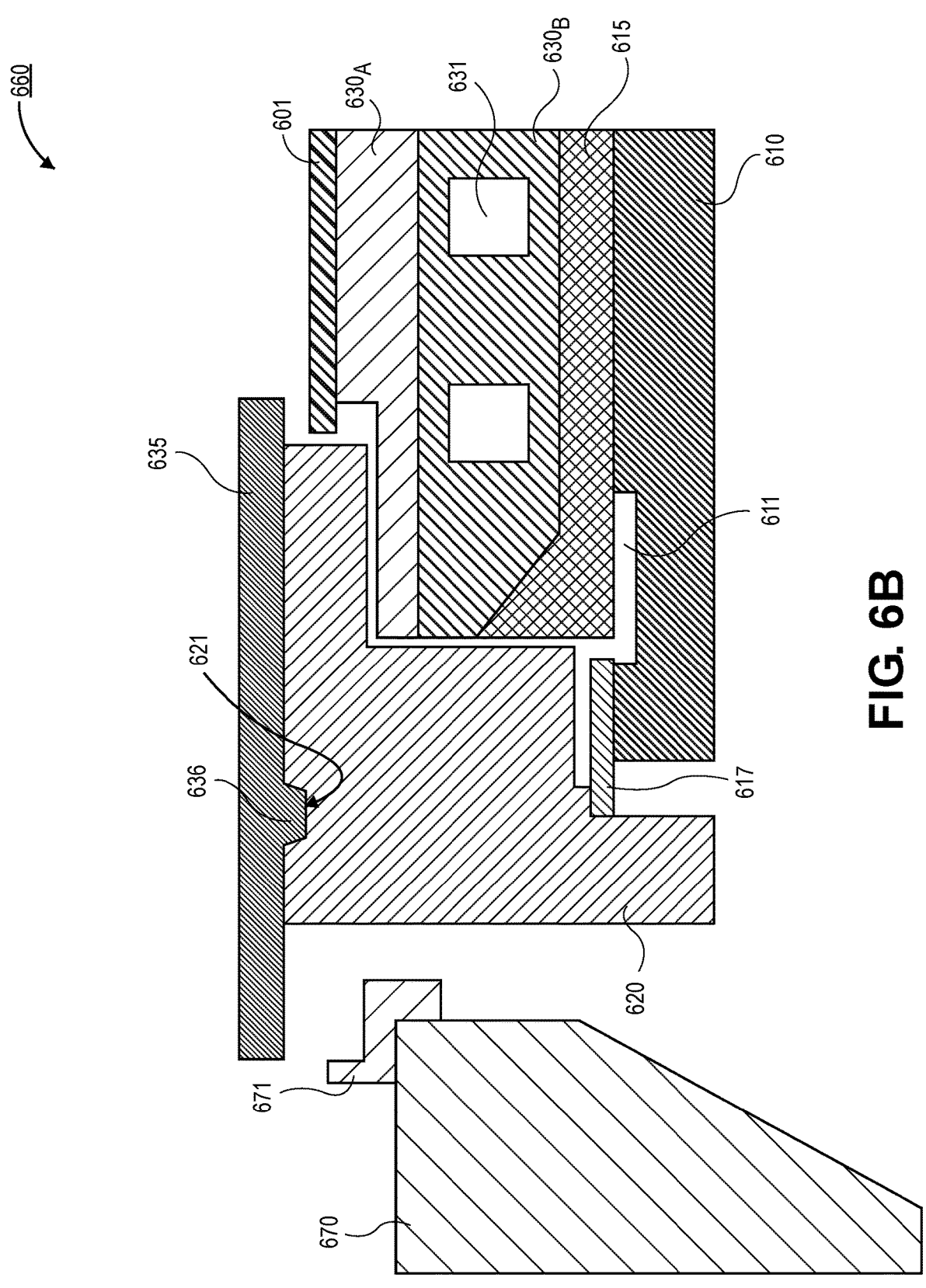
FIG. 6B is a zoomed in illustration of an edge of a displaceable column in a processing tool, where the shadow ring is engaged with the edge ring, in accordance with an embodiment of the present disclosure.

Referring now to FIGS. 6A and 6B, a pair of cross-sectional illustrations depicting portions of a processing tool with the pedestal at different locations (in the Z-direction) are shown, in accordance with an embodiment. In FIG. 6A, the pedestal is at a lower position within the chamber. The position of the pedestal in FIG. 6A is where the wafer is inserted or removed from the chamber through a slit valve. In FIG. 6B, the pedestal is at a raised position within the chamber. The position of the pedestal in FIG. 6B is where the wafer is processed. It is to be appreciated that the lift pin(s) described above in association with FIG. 2A can be implemented with the embodiments described below in association with FIGS. 6A and 6B.

Referring now to FIG. 6A, a cross-sectional illustration of a displaceable column 660 in a first position is shown, in accordance with an embodiment. As shown in FIG. 6A, the column includes a baseplate 610, an insulating layer 615, a pedestal 630 (i.e., first portion 630A and second portion 630B), and an edge ring 620. Such components may be substantially similar to the similarly named components described above. For example, cooling channels 631 may be provided in the second portion 630B of the pedestal 630, a channel 611 may be disposed in the baseplate 610, and a seal 617 may be provided between the edge ring 620 and the baseplate 610.

As shown in FIG. 6A, a wafer 601 is placed over a top surface of the pedestal 630. The wafer 601 may be inserted into the chamber through a slit valve (not shown). Additionally, the shadow ring 635 is shown at a raised position above the edge ring 620. Since the inner diameter of the shadow ring 635 is smaller than the diameter of the wafer 601, the wafer 601 needs to be placed on the pedestal before the shadow ring 635 is brought into contact with the edge ring 620.

In an embodiment, the shadow ring 635 is supported by a chamber liner 670. The chamber liner 670 may surround an outer perimeter of the column 660. In an embodiment, a holder 671 is positioned on a top surface of the chamber liner 670. The holder 671 is configured to hold the shadow ring 635 at an elevated position above the edge ring 620 when the column 660 is in the first position. In an embodiment, the shadow ring 635 includes a protrusion 636 for aligning with a notch 621 in the edge ring 620.

Referring now to FIG. 6B, a cross-sectional illustration of the column 660 after the shadow ring 635 is engaged is shown, in accordance with an embodiment. As shown, the column 660 is displaced in the vertical direction (i.e., the Z-direction) until the shadow ring 635 engages the edge ring 620. Additional vertical displacement of the column 660 lifts the shadow ring 635 off of the holder 671 on the chamber liner 670. In an embodiment, the shadow ring 635 is aligned properly as a result of the alignment features in the shadow ring 635 and the edge ring 620 (i.e., the notch 621 and the protrusion 636). In an additional embodiment, an alignment feature (not shown) may also be provided between the pedestal 630 and the edge ring 620. The alignment feature between the pedestal 630 and the edge ring 620 may include a tapered notch and protrusion architecture similar to the alignment feature between the edge ring 620 and the shadow ring 635.

While in the second position, the wafer 601 may be processed. Particularly, the processing may include a deposition of a photoresist material over a top surface of the wafer 601. For example, the process may be a dry deposition and oxidation treatment process with or without assistance of a plasma. In a particular embodiment, the photoresist is a metal-oxo photoresist suitable for EUV patterning. However, it is to be appreciated that the photoresist may be any type of photoresist, and the patterning may include any lithography regime. During deposition of the photoresist onto the wafer 601, an inert gas may be flown along the fluidic channel between the interior surface of the edge ring 610 and the outer surfaces of the insulating layer 615, the pedestal 630, and the wafer 601. As such, photoresist deposition along the edge or backside of the wafer 601 is substantially eliminated. In an embodiment, the wafer temperature 601 may be maintained between approximately −40° C. and approximately 200° C. by the cooling channels 631 in the second portion of the pedestal 630B.

Figure 7A:
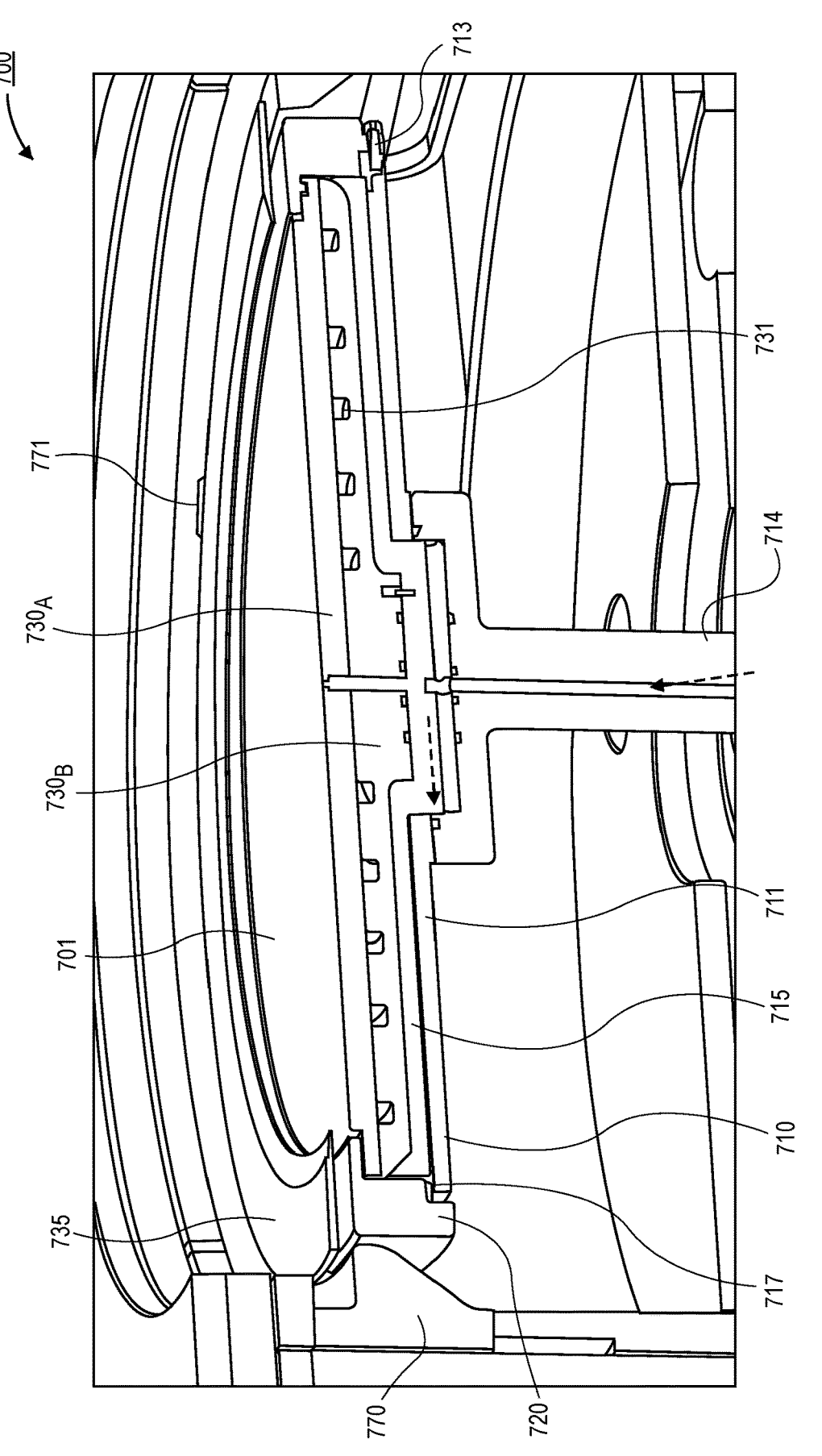
FIG. 7A is a sectional view of a processing tool for depositing a photoresist layer over a substrate with a dry deposition and oxidation treatment process, in accordance with an embodiment of the present disclosure.

Referring now to FIG. 7A, a sectional illustration of a processing tool 700 is shown, in accordance with an additional embodiment. It is to be appreciated that the lift pin(s) described above in association with FIG. 2A can be implemented with the embodiments described below in association with FIG. 7A. As shown in FIG. 7A, the column includes a baseplate 710. The baseplate 710 may be supported by a pillar 714 that extends out of the chamber. That is, in some embodiments, the baseplate 710 and the pillar 714 may be discrete components instead of a single monolithic part as shown in FIG. 4. The pillar 714 may have a central channel for routing electrical connections and fluids (e.g., cooling fluids and inert gasses for the purge flow).

In an embodiment, an insulating layer 715 is disposed over the baseplate 710, and a pedestal 730 (i.e., first portion 730A and second portion 730B) are disposed over the insulating layer 715. In an embodiment, coolant channels 731 are provided in the second portion 730B of the pedestal 730. A wafer 701 is disposed over the pedestal 730.

In an embodiment, an edge ring 720 is provided around the baseplate 710, the insulating layer 715, the pedestal 730, and the wafer 701. The edge ring 720 may be coupled to the baseplate 713 by a fastening mechanism 713, such as a bolt, pin, screw, or the like. In an embodiment, a seal 717 blocks the purge gas from exiting the column out the bottom between a gap between the baseplate 710 and the edge ring 720.

In the illustrated embodiment, the pedestal 730 is in the first position. As such, the shadow ring 735 is supported by the holders 771 and the chamber liner 770. As the pedestal 730 is displaced vertically, the edge ring 720 will engage with the shadow ring 735 and lift the shadow ring 735 off of the holders 771.

Figure 7B:
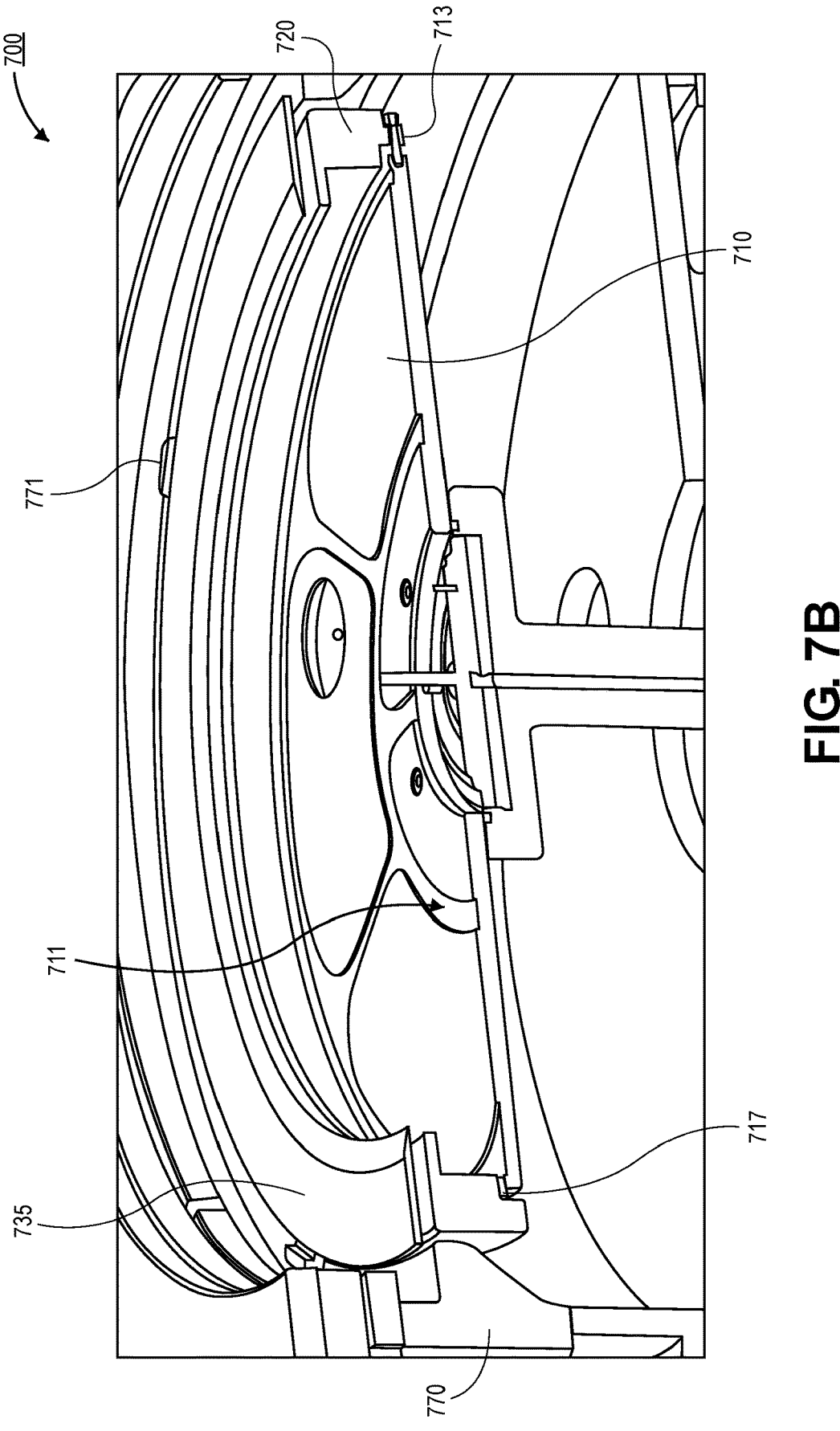
FIG. 7B is a sectional view of a processing tool with the pedestal removed to expose the channels in a baseplate, in accordance with an embodiment of the present disclosure.

Referring now to FIG. 7B, a sectional illustration of the chamber 700 is shown, in accordance with an additional embodiment. It is to be appreciated that the lift pin(s) described above in association with FIG. 2A can be implemented with the embodiments described below in association with FIG. 7B. In the illustration of FIG. 7B, the insulating layer 715 and the pedestal 730 are omitted in order to more clearly see the construction of the baseplate 710. As shown, the baseplate 710 may include a plurality of channels 711 that provide fluidic routing from a center of the baseplate 710 to an edge of the baseplate 710. In the illustrated embodiment, a plurality of first channels connect the center of the baseplate 710 to a first ring channel, and a plurality of second channels connect the first ring channel to the outer edge of the baseplate 710. In an embodiment, the first channels and the second channels are misaligned from each other. While a specific configuration of channels 711 is shown in FIG. 7B, it is to be appreciated that any channel configuration may be used to route inert gasses from the center of the baseplate 710 to the edge of the baseplate 710.

Figure 8:
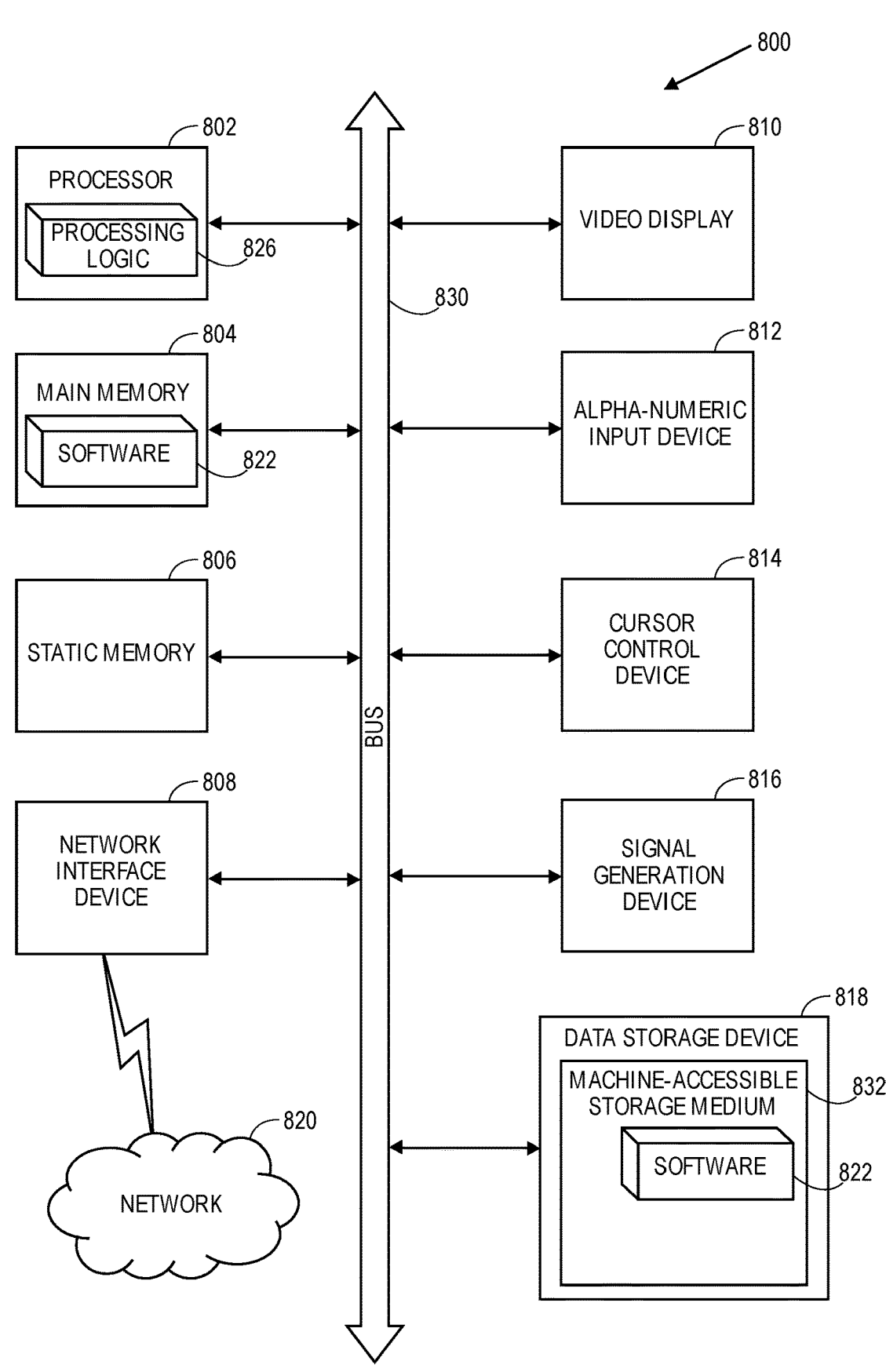
FIG. 8 illustrates a block diagram of an exemplary computer system, in accordance with an embodiment of the present disclosure.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), MRAM, etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of chucking a wafer using a lift-pin assembly including a first metal spring, a first metal above and coupled to the first metal spring, a second metal spring above and coupled to the first metal, a second metal above and coupled to the second metal spring, and a ceramic above and coupled to the second metal.

Thus, apparatuses for clamping a substrate on a mono-polar electrostatic chuck for deposition of photoresist films have been disclosed.

What is claimed is:

1. A lift-pin assembly, comprising:
a first metal spring;
a first metal above and coupled to the first metal spring;
a ceramic above and coupled to the first metal; and
a second metal spring above and coupled to the first metal, and a second metal above and coupled to the second metal spring, wherein the ceramic is above and coupled to the second metal.

2. The lift pin assembly of claim 1, wherein the first metal spring provides a consistent ground path for the lift-pin assembly.

3. The lift pin assembly of claim 1, wherein the first metal spring provides compliance for the lift-pin assembly.

4. The lift pin assembly of claim 1, wherein the first metal spring provides guided linear motion for the lift-pin assembly.

5. The lift pin assembly of claim 1, wherein the second metal spring provides contact pressure for the lift-pin assembly.

6. The lift pin assembly of claim 1, wherein the ceramic is for supporting a wafer, and wherein the ceramic comprises SiC.

7. A mono-polar electrostatic chuck, comprising:
a chuck body;
a plurality of lift-pin holes in the chuck body; and
a plurality of lift-pins, individual ones of the plurality of lift-pins in corresponding ones of the plurality of lift-pin holes, wherein each of the plurality of lift-pins comprises:
a first metal spring;
a first metal above and coupled to the first metal spring;
a second metal spring above and coupled to the first metal;
a second metal above and coupled to the second metal spring; and a ceramic above and coupled to the second metal.

8. The mono-polar electrostatic chuck of claim 7, wherein the first metal spring of each of the plurality of lift-pins provides a consistent ground path for the lift-pin assembly.

9. The mono-polar electrostatic chuck of claim 7, wherein the first metal spring of each of the plurality of lift-pins provides compliance for the lift-pin assembly.

10. The mono-polar electrostatic chuck of claim 7, wherein the first metal spring of each of the plurality of lift-pins provides guided linear motion for the lift-pin assembly.

11. The mono-polar electrostatic chuck of claim 7, wherein the second metal spring of each of the plurality of lift-pins provides back pressure for the lift-pin assembly.

12. The mono-polar electrostatic chuck of claim 7, wherein the second metal spring of each of the plurality of lift-pins provides contact pressure for the lift-pin assembly.

13. The mono-polar electrostatic chuck of claim 7, wherein the ceramic of each of the plurality of lift-pins is for supporting a wafer, and wherein the ceramic comprises SiC.

14. A system, comprising:
a chamber;
a plasma source within or coupled to the chamber; and
a mono-polar electrostatic chuck within the chamber, the mono-polar electrostatic chuck comprising:
a chuck body;
a plurality of lift-pin holes in the chuck body; and
a plurality of lift-pins, individual ones of the plurality of lift-pins in corresponding ones of the plurality of lift-pin holes, wherein each of the plurality of lift-pins comprises:
a first metal spring;
a first metal above and coupled to the first metal spring;
a second metal spring above and coupled to the first metal;
a second metal above and coupled to the second metal spring; and
a ceramic above and coupled to the second metal.

15. The system of claim 14, wherein the first metal spring of each of the plurality of lift-pins of the mono-polar electrostatic chuck provides a consistent ground path for the lift-pin assembly.

16. The system of claim 14, wherein the first metal spring of each of the plurality of lift-pins of the mono-polar electrostatic chuck provides compliance for the lift-pin assembly.

17. The system of claim 14, wherein the first metal spring of each of the plurality of lift-pins of the mono-polar electrostatic chuck provides guided linear motion for the lift-pin assembly.

18. The system of claim 14, wherein the second metal spring of each of the plurality of lift-pins of the mono-polar electrostatic chuck provides back pressure for the lift-pin assembly, and wherein the second metal spring of each of the plurality of lift-pins of the mono-polar electrostatic chuck provides contact pressure for the lift-pin assembly.

19. The system of claim 14, wherein the ceramic of each of the plurality of lift-pins of the mono-polar electrostatic chuck is for supporting a wafer, and wherein the ceramic comprises SiC.

\* \* \* \* \*